United States Patent [19]

Wasulko

[11] Patent Number: 4,959,008
[45] Date of Patent: Sep. 25, 1990

[54] PRE-PATTERNED CIRCUIT BOARD DEVICE-ATTACH ADHESIVE TRANSFER SYSTEM

[75] Inventor: William M. Wasulko, Anderson, S.C.

[73] Assignee: National Starch and Chemical Investment Holding Corporation, Wilmington, Del.

[21] Appl. No.: 605,523

[22] Filed: Apr. 30, 1984

[51] Int. Cl.$^5$ .................... A61F 13/02; H05K 1/02; B44C 1/17

[52] U.S. Cl. .................... 428/40; 428/213; 428/216; 428/204; 428/209; 428/323; 428/901; 174/255; 156/230

[58] Field of Search ............... 427/96, 208.2; 156/235, 156/248, 277, 230, 249, 315, 302, 289, 239, 233, 297, 299, 307.7; 29/DIG. 1, 583; 428/40, 213, 216, 148, 172, 209, 202, 204, 206, 901, 214, 908, 323, 356, 328, 343; 252/512, 518, 513; 174/68.5, 255, 257

[56] References Cited

U.S. PATENT DOCUMENTS

| | | | |
|---|---|---|---|
| 3,676,252 | 7/1972 | Allington | 156/277 |
| 3,703,603 | 11/1972 | Levesoue et al. | 174/68.5 |
| 3,741,786 | 6/1973 | Torrey | 156/344 |
| 3,910,852 | 10/1975 | Lederman et al. | 252/512 |
| 3,950,200 | 4/1976 | Muramato et al. | |
| 4,050,976 | 9/1977 | Reiters | 156/233 |
| 4,242,400 | 12/1980 | Smith et al. | 156/239 |
| 4,254,186 | 3/1981 | Acitelli et al. | 156/233 |
| 4,285,433 | 8/1981 | Garrett, Sr. et al. | |
| 4,377,619 | 3/1983 | Schouhorn | 427/96 |
| 4,437,140 | 3/1984 | Ohyama et al. | 427/96 |
| 4,606,962 | 8/1986 | Reylek et al. | 428/148 |

FOREIGN PATENT DOCUMENTS

| | | | |
|---|---|---|---|
| 49-4057 | 1/1974 | Japan | 427/96 |
| 59-57438 | 4/1984 | Japan . | |
| 7713911 | 6/1979 | Netherlands | 156/249 |

OTHER PUBLICATIONS

IBM-Technical Disclosure-Immendörfer, vol. 4, No. 12, May 1982, p. 18.

Primary Examiner—Michael W. Ball
Assistant Examiner—Louis Falasco
Attorney, Agent, or Firm—Royal N. Ronning, Jr.

[57] ABSTRACT

A pre-patterned circuit board device-attach transfer tape is described which allows a one step mounting of adhesive patterns on a circuit board in the desired configuration for later mounting of surface mounted devices (e.g., semiconductor dies) thereon. The tape product contains the adhesive pattern in a mirror image to that desired on the exposed surface of the circuit board. The product of the present invention is utilized by bringing the tape product into contact with the circuit board so that the adhesive on the carrier film bonds to the desired surface of the circuit board thereby bringing the adhesive patterns into the desired configuration desired on the circuit board. The use of pressure and, possibly, heat preferentially bonds the adhesive to the circuit board and allows for later stripping of the support film from the support film/adhesive/circuit board composite. This step leaves behind the desired adhesive configuration on the circuit board and allows for later bonding of appropriate surface mounted devices to the circuit board.

26 Claims, 1 Drawing Sheet

PRE-PATTERNED CIRCUIT BOARD DEVICE-ATTACH ADHESIVE TRANSFER SYSTEM

BACKGROUND OF THE INVENTION

The present invention relates to the attachment of electrically conductive adhesives to a circuit board which are intended to hold surface mounted devices, e.g., semiconductor devices (also termed "dies"), capacitors, resistors, etc. More particularly, it relates to a carrier film holding a series of adhesive patterns which are in the configuration desired for placement of the devices on the circuit board.

In copending U.S. application Ser. No. 519,936, now abandoned, entitled "Carrier Film with Conductive Adhesive for Dicing of Semiconductor Wafers", filed in the name of Joseph A. Aurichio, a carrier film having a series of conductive adhesive patterns thereon for dicing of semiconductor wafers into dies is described. It is contemplated that after the die had been cut from the wafer, the adhesive/die combination would be removed from the carrier film and then affixed to an appropriate circuit board. The carrier film product described in that application did not have the adhesive patterns in the ultimate configuration desired for a plurality of semiconductor devices on a circuit board so as to allow bonding of the carrier film to the circuit board with ultimate placement of the adhesive patterns in the desired configuration. The product was solely directed to a means for supporting semiconductor wafers for dicing in which the adhesive patterns on the film were not necessarily in any particular configuration which would bear a relationship to the position which the adhesive would need to have on the circuit board to allow proper placement of devices thereon.

Subsequently, in copending U.S. patent application Ser. No. 574,815, now abandoned, entitled "Conductive Die Attach Tape", also filed in the name of Joseph A. Aurichio, a conductive die attach tape is described. In such a tape product, a support tape contained a pattern of adhesive of a size and shape to support a semiconductor chip thereon. The individual chips would be positioned over the corresponding adhesive and contacted therewith. After contact between the chip and support film/adhesive composite had been made, the chip would be removed from the film with its adherent adhesive support. The individual chip/adhesive composite would then be placed into a suitable chip carrier on the desired circuit board and would be cured in an appropriate fashion prior to the wire bonding step. Once again, the product shown in this application is not intended to give a pre-patterned configuration of adhesive on a support film which could be later employed in transferring such a configuration of adhesive to a circuit board with the adhesive being in the appropriate places for attachment of a plurality of semiconductor devices to the circuit board.

In the assembly of circuit boards, especially hybrid circuit boards containing various surface mounted devices, e.g., semiconductor devices, in various locations, the devices are adhesively mounted directly to the circuit board substrate and are then appropriately bonded to the conductive circuit. Conventionally, the adhesive is conductive, e.g., a silver-filled epoxy, and is usually applied via either syringe or screen printing. Usually, the devices are automatically picked from a suitable device, i.e., a waffle pack, and are then placed onto the predeposited adhesive pattern with subsequent curing. Sometimes, other devices which have been soldered are already present on the substrate thereby causing problems in regard to screen printing of the adhesive because of the location of such soldered devices.

Therefore, a need exists for elimination of the conventional manner of using potentially difficult-to-handle epoxies which many times have short shelf lives and which often need to be kept frozen until use. Conventional procedures for applying adhesive mountings to circuit boards in the desired locations can involve wastage of wet adhesive which, due to improper handling and use, must then be discarded if not employed. There also is a need to eliminate the actual application for wet adhesive by the assembler and to provide a means of placing adhesive on the circuit board in the desired locations which is not easily amenable to conventional screen printing techniques.

SUMMARY OF THE INVENTION

The present invention involves the use of a prepatterned circuit board device-attach adhesive transfer system involving a carrier film which releasably holds adhesive in the desired configuration and the desired number of sites for the finished circuit board pattern. The carrier film containing such an adhesive configuration can be formed, for example, by screen printing the adhesive in the desired configuration on the carrier film which has either an inherent release characteristic or a suitable release layer thereon to allow for subsequent detachment of the adhesive. If desired, the adhesive can be staged to a tacky film (i.e., by partial curing) and covered with another protective release film to protect the adhesive from contamination by dirt or other undesired debris. The product may be in either sheet form or continuous tape with one frame of board pattern following another.

In order to use the present invention, any optional, protective release film covering the adhesive can first be removed, and the desired portion of film containing the desired "frame" can then be laid over the circuit board substrate, e.g., alumina in the case of thick film circuits. The film is superimposed over the board in register to other desired board functions, and the adhesive is then transferred to the board via a suitable degree of low pressure and, possibly, heat. When it is desired to assemble the desired surface mounted devices on the adhesive, the film can be stripped from the adhesive/board subcombination, and a conventional (e.g., die "pick and place") set of procedures can be executed to place the desired devices on the desired adhesive mounting sites. After all mounting has been accomplished, the adhesive can then be cured to its desired state by additional heating. One possible optional variation of the present invention is the inclusion of suitable cut-out areas in the desired "frame" of adhesive configuration for the circuit board to allow for fitting of the film over previously mounted, e.g, soldered, components during the application of the adhesive to the board. Any soldered components that may already be on the circuit board would register with the cut-out area or or areas so as to allow the clean mating of the surrounding portions of the carrier film with the board to allow the adhesive on those portions to make suitable contact to the board.

DESCRIPTION OF THE DRAWINGS

The present invention can be further understood by reference to the Drawings which form a portion of the present specification wherein.

DETAILED DESCRIPTION OF SOME PREFERRED EMBODIMENTS OF THE PRESENT INVENTION

Figure 1:
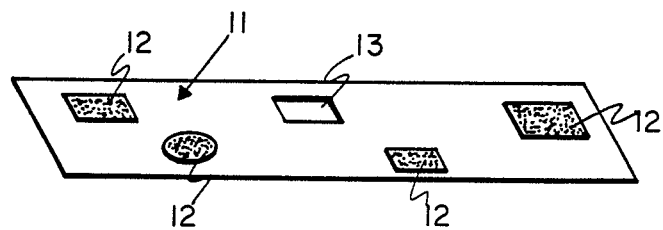
FIG. 1 is a perspective view of a portion of the carrier tape showing a series of adhesive patterns and a cut-out area to allow for later placement of the film over a circuit board containing a previously soldered semiconductor component.

FIG. 1 shows, in perspective view, an embodiment of the present invention which comprises a support film 11, a series of adhesive patterns 12 that are in the desired configuration they will occupy when the product of FIG. 1 is brought into mating contact with the circuit board, and a cut-out area 13 which is adapted to register with a previously soldered component contained on a circuit board.

If desired, the product of FIG. 1 can also contain an optional release liner (not shown) over the exposed surface of the adhesive patterns 12 to protect the adhesive from contamination by foreign matter (e.g., dirt, dust, etc.). The adhesive 12 needs to release from the support film 11 after the support film/adhesive combination is mated to a circuit board and the support film 11 is then stripped from the resulting combination. Therefore, it is generally desired that a suitable release layer be placed on the support film 11 to lie between it and the adhesive 12.

Representative support films 11 which can be used in the product of the present invention include paper and such well known thermoplastic polymers as olefin polymers (e.g., polyethylene, polypropylene), vinyl halide polymers, and polyester resins. The thickness of the support film can vary widely and can range, for example, from about 12 to about 250 microns with a thickness of from about 50 to about 125 microns being preferred.

Coated on one side of the support film, in a preferred embodiment, is a suitable release layer which, as will be mentioned below, allows for ultimate easy separation of the adhesive/circuit board combination from the support film after the support film and and conductive adhesive have been bonded to the circuit board. Representative release layers can comprise silicone and fluorocarbon compositions such as those described in the prior art (e.g., as shown in U.S. Pat. Nos. 3,912,569 and 3,575,917 to A. M. Kapral). These release layers need only be thick enough to confer the desired release properties (e.g., from about 0.23 to about 0.91 kg per ream). If the surface of the support film has an inherent release layer function (e.g., polyfluorocarbon), the inherent release characteristics of its surface can be utilized in accordance with the present invention as the "release layer". A commercial source of suitable silicone release coated polymer film (e.g., polypropylene with SILOX brand release coating) is Akrosil Corporation of Menasha, WI.

It may also be possible to dispense with the release layer if polymers having a release feature upon heating are used. For example a polyolefin film, such as polypropylene, can be heated (e.g., for 0.25 to 3 minutes at 45° C.–70° C.) after the carrier board and adhesive are bonded to one another to ensure later clean release of the carrier film/adhesive composite.

Attached to the exposed surface of the release layer (or a film having an inherent release characteristic) is a suitable pattern of conductive adhesive 12 to form a point of attachment for later bonding to the circuit board. When the film 11 is viewed from above on the side containing the adhesive pattern, the pattern of adhesive 12 will be in the mirror image that is desired if one were to view the circuit board from above. The thickness of the adhesive can range from about 5 microns to about 75 microns. Suitable conductive adhesive compositions which can be utilized include those adhesive materials which are loaded with fillers to effect the needed conductivity requirements for the adhesive (e.g., 2% to about 90%, by weight of a suitable conductive material). Representative conductive materials include finely divided conductive metals (e.g., aluminum, copper, silver, gold, platinum), or carbon black. Representative adhesive materials which can form a matrix for the conductive materials include polyimide, acrylic, epoxy, silicones, and various modified polymeric materials to meet desired thermal and conductivity requirements. One suitable type of adhesive is a metal-filled (e.g., silver) polyimide resin (P-1011 brand from Epoxy Technology, Inc.).

As mentioned above, the film product of the present invention can include a suitable release liner over the exposed surface of the adhesive 12 to protect it from contamination. For example, release coated paper can be employed as the release liner material. The release liner can have a different release characteristic than the release layer if a release layer is used on the support film 11.

The film of the present invention can be formed using conventional lamination and printing operations. The release layer can, for example, be coated onto the support film 11 using conventional coating techniques followed by drying of the layer. The pattern of conductive adhesive 12 can then be applied to a release paper by appropriate printing procedures, e.g., screen printing, and then the adhesive/release liner composite can then be transferred to the support film by lamination.

Figure 2:
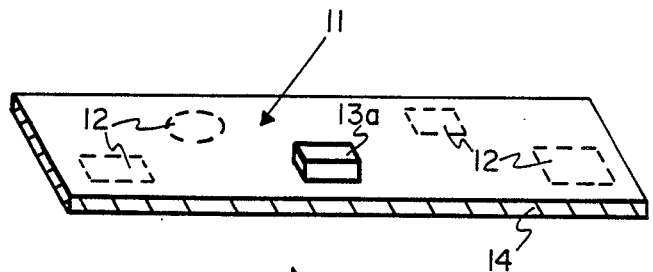
FIG. 2 is a perspective view showing the product of FIG. 1 bonded to a circuit board.

Use of the product shown in FIG. 1 is rather straight forward. The exposed adhesive on the product of FIG. 1 can be brought into contact with the desired surface of a circuit board 14 (as illustrated in FIG. 2) on which the devices are to be affixed. If desired, appropriate registration marks can be provided on the circuit board 14 and film 11 to insure proper placement. In the case of the embodiment shown, e.g., in FIG. 3, the cut-out portion 13 fits over a surface mounted device 13a which had previously been bonded to the circuit board 14 by means of soldering techniques. The use of a suitable amount of pressure and, possibly, heat will transfer the adhesive preferentially to the board and will allow for later stripping of the carrier film 11 therefrom, when desired, leaving the exposed adhesive on the circuit board 14. In the configuration shown on the right hand side of FIG. 3, however, a person can leave the support film 11 in place to function as a protective release film over the adhesive.

Figure 3:
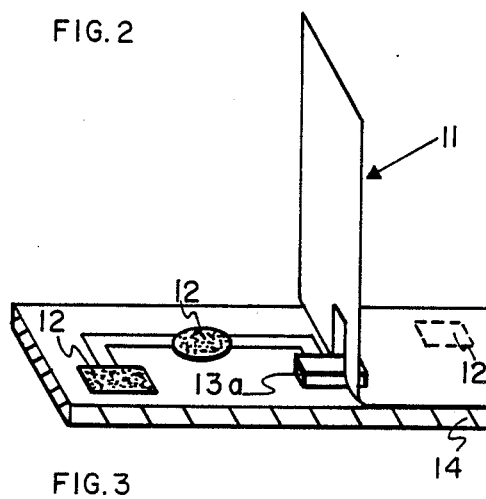
FIG. 3 is a perspective view showing stripping of the film after the product of FIG. 1 has been bonded to the circuit board with the position of the adhesive locations noted.
Figure 4:
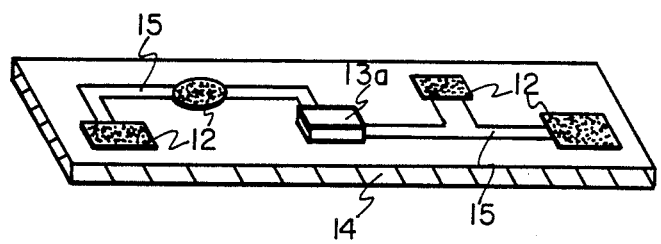
FIG. 4 is a perspective view showing the circuit board after the adhesive patterns on the product shown in FIG. 1 have been placed on the board in their desired positions.
Figure 5:
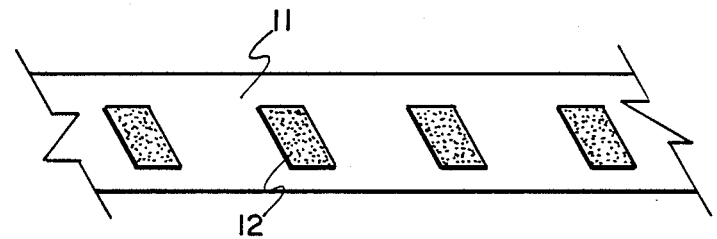
Figure 6:
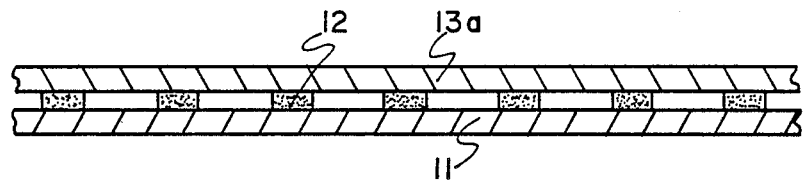
Figure 7:
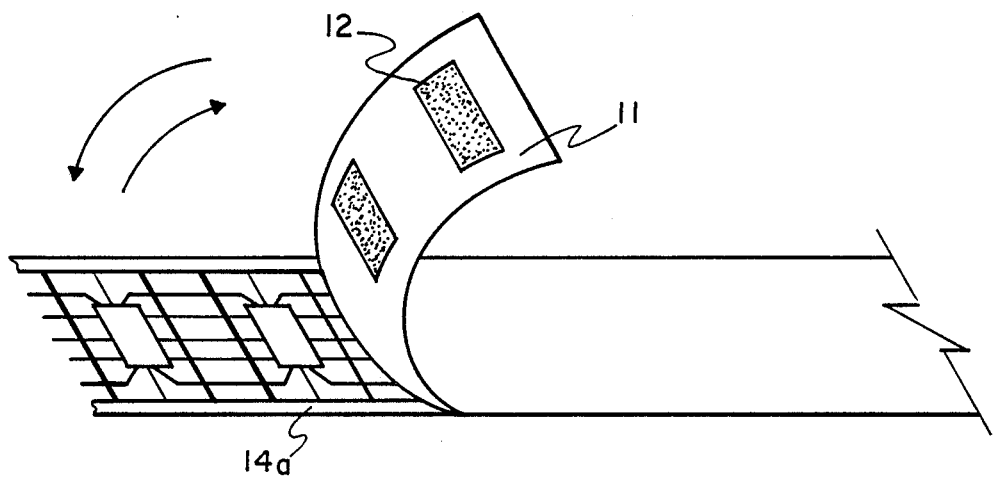
Figure 8:
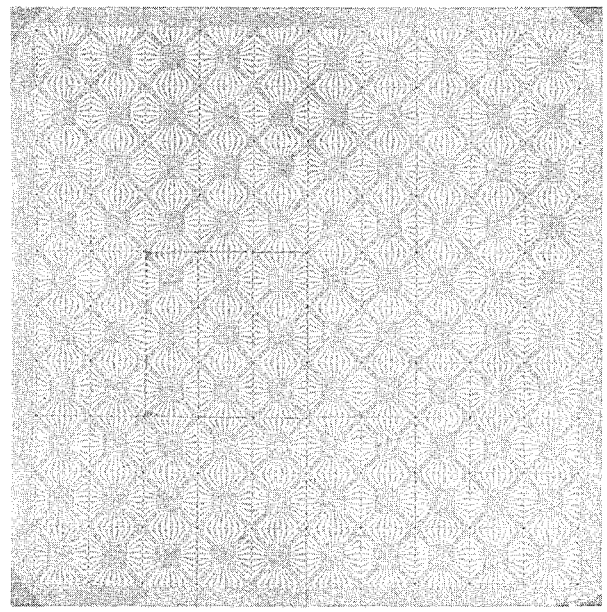

The next step in utilizing the present invention is to strip the carrier film 11 from the adhesive configuration 12 which is now fastened more preferentially to the circuit board 14. This operation is shown in FIG. 3. After this has been done, the product of FIG. 4 is obtained wherein circuit board 14 has the desired pattern of conductive adhesive 12 thereon so as to allow for later bonding of the surface mounted devices (e.g., semiconductor devices) to the adhesive sites followed by later conventional steps such as bonding to the conductive pathways 15 on the board 14 (e.g., by wire bonding).

The present invention is further illustrated by means of the claims which follow.

What is claimed:

1. A circuit board device attach tape which comprises:
   (a) a support film; and
   (b) a pattern of curable conductive adhesive releasably affixed to one side of support film, the adhesive pattern being of a size and shape so that when brought into contact with a circuit board, the adhesive is in a pattern suitable for later attachment thereon of surface mounted devices to the circuit board.

2. A tape as claimed in claim 1 in which the support film is formed of a polyolefin polymer.

3. A tape as claimed in claim 1 wherein the support film is polyethylene.

4. A tape as claimed in claim 1 wherein the support film has a thickness of from about 12 microns to about 250 microns.

5. A tape as claimed in claim 1 which further comprises a release layer on the film between the support film and the adhesive.

6. A tape as claimed in claim 5 wherein the release layer comprises a silicone composition.

7. A tape as claimed in claim 5 wherein the release layer comprises a fluorocarbon composition.

8. A tape as claimed in claim 1 wherein the conductive adhesive has a thickness of from about 5 microns to about 75 microns.

9. A tape as claimed in claim 1 wherein the conductive adhesive contains an effective amount for conductivity of a conductive metal in an adhesive matrix.

10. A tape as claimed in claim 2 wherein the support film has a thickness of about 12 microns to about 250 microns.

11. A tape as claimed in claim 9 which has a release layer on the film between it and the adhesive, said release layer comprising a silicone composition.

12. A tape as claimed in claim 11 having a conductive adhesive of a thickness of from about 5 microns to about 75 microns and wherein the adhesive contains an effective amount for conductivity of a conductive metal in an adhesive matrix.

13. A tape as claimed in claim 1 which also has a release liner over the pattern of conductive adhesive.

14. A film as claimed in claim 12 which also has a release liner over the pattern of conductive adhesive.

15. In combination, a circuit board and the tape product of claim 1.

16. In combination, a circuit board and the tape product of claim 2.

17. In combination, a circuit board and the tape product of claim 3.

18. In combination, a circuit board and the tape product of claim 4.

19. In combination, a circuit board the the tape product of claim 5.

20. In combination, a circuit board and the tape product of claim 6.

21. In combination, a circuit board and the tape product of claim 7.

22. In combination, a circuit board and the tape product of claim 8.

23. In combination, a circuit board and the tape product of claim 9.

24. In combination, a circuit board and the tape product of claim 10.

25. In combination, a circuit board and the tape product of claim 11.

26. In combination, a circuit board and the tape product of claim 12.

* * * * *